United States Patent [19]

Seifert

[11] 3,792,321

[45] Feb. 12, 1974

[54] PIEZOELECTRIC SEMICONDUCTOR DEVICES IN WHICH SOUND ENERGY INCREASES THE BREAKDOWN VOLTAGE AND POWER OF CAPABILITIES

[76] Inventor: Franz Seifert, Neuwaldeggerstrasse 47, Vienna, Austria

[22] Filed: Aug. 22, 1972

[21] Appl. No.: 282,766

[30] Foreign Application Priority Data

Aug. 26, 1971 Austria .......... 7492
Dec. 31, 1971 Austria .......... 11305

[52] U.S. Cl. . 317/235 R, 317/235 M, 317/235 AD, 307/310, 333/30, 333/31

[51] Int. Cl. .......... H01l 11/00, H01l 15/00

[58] Field of Search .......... 307/310; 317/235, 26, 43; 310/8; 333/30, 31

[56] References Cited

UNITED STATES PATENTS

| | | | |
|---|---|---|---|
| 2,916,639 | 12/1959 | Krembs | 317/235 M |
| 3,200,354 | 8/1965 | White | 317/235 M |
| 3,240,962 | 3/1966 | White | 317/235 M |
| 3,274,406 | 9/1966 | Sommers | 317/235 M |
| 3,377,588 | 4/1968 | Picquendar et al. | 317/235 M |
| 3,387,230 | 6/1968 | Marinace | 317/235 M |
| 3,388,334 | 6/1968 | Adler | 317/235 M |
| 3,414,832 | 12/1968 | Newell | 317/235 M |
| 3,465,176 | 9/1969 | Tanaka et al. | 317/235 M |

*Primary Examiner*—John S. Heyman
*Assistant Examiner*—Andrew J. James
*Attorney, Agent, or Firm*—Hill, Sherman, Meroni, Gross & Simpson

[57] ABSTRACT

This invention relates to electronic devices including a semiconductor member wherein charge carriers in addition to those present at thermal equilibrium of the semiconductor are injected into the semiconductor and are transported by means of controlled sound waves for the purpose of controlling, amplifying or distributing electrical charges or for converting optical images into electrical signals.

15 Claims, 10 Drawing Figures

PIEZOELECTRIC SEMICONDUCTOR DEVICES IN WHICH SOUND ENERGY INCREASES THE BREAKDOWN VOLTAGE AND POWER OF CAPABILITIES

BACKGROUND OF THE INVENTION

1. Field of the Invention

This invention is in the field of semiconductor components wherein additional charge carriers are injected into the semiconductor and are transported through the semiconductor by virtue of sonic waves.

2. Description of the Prior Art

Conventional semiconductor diodes consist of a semiconductor crystal containing a p-n, p-i-n or p-s-n structure determined by the type and amount of doping materials added. The portion of a semiconductor which exhibits hole conductivity at thermal equilibrium is designated as a *p* area, while that portion of the semiconductor with electron conductivity is denoted as *n* material. The *i* material is intrinsic semiconductor material, and *s* material is very weakly doped or compensated material. The diode permits electric current flow when a positive voltage is applied at a *p* area, and it suppresses current flow of the opposite polarity. When an abrupt change from forward to reverse polarity is applied, a storage charge storage effect is produced especially in p-i-n and p-s-n diodes, causing a time-limited duration of the current flow in the reverse direction due to the accumulation of injected charge carriers between the p-n regions. The charge storage effect may be utilized for microwave power control or pulse forming, respectively, in a micro-wave p-i-n switching diode or step recovery diode, but is generally undesirable in a high voltage rectifier diode.

Bipolar transistors have been widely used for electrical amplification. These transistors consist of an emitter, base and collector zones of p-n-p, n-p-n, p-n-s-p, or n-p-s-n structure. The amplifying is performed by means of an emitter-base junction which is biased in the forward direction, and by means of a collector-base junction operated in the reverse direction. The emitter injects minority carriers into the base, which diffuse through the base and cause the collector current. Recombination losses in the base lower the amplification of the transistor so that a thinner base is required than the diffusion length. In order to obtain power amplification up to high frequencies, a base zone of small thickness is required since the time constant of the diffusion from the emitter to the collector is proportional to the square of the base thickness. Thus, there are inherently limits to the breakdown limitations to which a transistor can be exposed with respect to voltage and power, due to the geometry of the device.

Prior art arrangements for converting an optical image into electrical signals are known as image converters. In these converters, the optical image is converted into a time varying electrical signal by means of raster type scanning with an electron beam, and the amplitude of the electrical signals is a measure of the light intensity at the scanned points.

SUMMARY OF THE INVENTION

The present invention provides an application of a newly discovered physical effect to electronic and optoelectronic elements. Electric components according to the present invention are characterized by the presence of sound waves which are induced in a piezoelectric semiconductor member by means of suitable devices, to cause a spatial transport of charge carriers which are supplied in addition to the ones already present in thermal equilibrium. The sound waves delay the recombination process of the added perturbance of the thermal equilibrium distribution and may be replaced by non-equilibrium carrier concentration, that is, the lifetime of the additional charge carriers with respect to acoustically non-influenced charge carriers is prolonged.

The components of the present invention used for the control and amplification of electrical power are constructed somewhat similar to the above-mentioned bipolar diodes and transistors. A device for the distribution of electrical power consists of a semiconductor member wherein a number of emitters and collectors such as p-n junctions or metal-semiconductor contacts are applied by means of prior art techniques such as diffusion and alloying. Another embodiment of a component according to the present invention, e.g., for optoelectronical application for converting an optical image focused on a component element into an electrical signal is characterized in that it consists of a semiconductor member resting in face contact with a strongly piezoelectric base member or has been grown thereon epitaxially, and charge carriers are injected into the semiconductor member by means of electrical or optical emitters, in addition to the ones already present during thermal equilibrium. Devices are provided at the semiconductor member and/or sound transducers at the piezoelectric base member which are supplied with electrical energy which is there converted into sound energy which propagates in the form of a sound wave, in particular a surface wave, in the vicinity of the boundary layer between the base member and the semiconductor in such a direction as to cause a spatial shifting of the injected charge carriers in this direction which causes an increase of the current in the collector diodes, that is, in small p-n junctions which are semiconductor diodes biased by a voltage source in the reverse direction, and this increase in the flowing current will cause a voltage increase at a load resistor.

DESCRIPTION OF THE PREFERRED EMBODIMENTS

Figure 1:
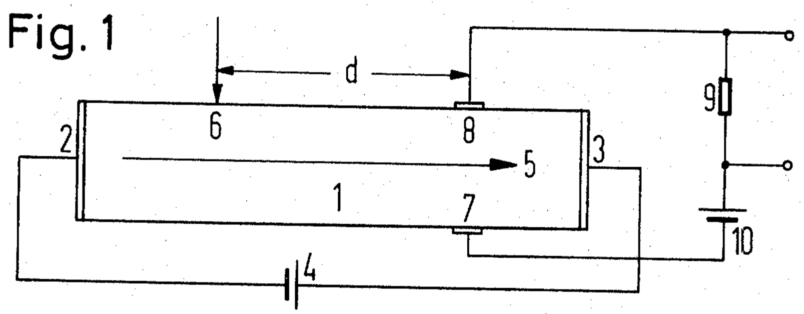
FIG. 1 illustrates a device produced according to the present invention.

The effect on which the present invention is based is believed to be as follows. If sound waves within the frequency range of several MHz to a few GHz are induced in a piezoelectric semiconductor, propagating parallel to the piezoelectrically active crystal directions, an electrical polarization will be produced in the propagation direction of the sound. This polarization follows the mechanical strain of the piezoelectric medium and is thus a spatially periodically alternating electric field which is associated with the sound wave and travels in the semiconductor at the speed of sound. If the piezoelectric potential caused by the sound oscillations is greater than the thermal energy of the charge carriers, the latter will arrange themselves in the minimums and maximums of the piezoelectric potential. In a plane sound wave of sufficiently high intensity, the electrons are thus concentrated at the place of the potential maximums and the holes in layers parallel thereto which are spatially separated by a half wave length of the sound. When the thermal concentration equilibrium of the entire semiconductor is disturbed, for example, due to the injection of minority carriers in an n- or p-semiconductor, this acoustic bunching in spatially separated layers will prevent the direct recombination of the surplus charge carriers.

Since the piezoelectric potential and thus the concentration layers of the carriers move along with the sound wave, they can be transported by the sound waves. Thus, a suitable selection of the propagation direction and the intensity distribution of the sound wave at a certain point of the semiconductor will result in the possibility of transporting minority carriers in a selected direction, which, for example, have been injected by a forwardly biased p-n junction without applying an electrical field. The carriers transported in the sound beam may be recollected after a time $t$ by means of a p-n junction which is biased in the reverse direction and which is located in the sound beam at a distance $d$ from the emitter. The time $t$ will be equal to the distance d divided by the speed of sound and is only slightly temperature dependent like the speed of sound.

As opposed to prior art devices, however, the transport of minority carriers is not determined by their density gradients and the diffusion constant or by electrical fields, but according to this invention, can be controlled by the selection of the direction and the spatial and time-dependent intensity distribution of the sound wave. With a complete bunching, a two-dimensional diffusion is only possible in the concentration layers normal to the sound propagation direction which move along with the sound wave.

A complete bunching was assumed in the above description of the effect. It is required for the transport of all additional charge carriers and in order to prevent their recombination. If the piezoelectric potential of the sound wave does not suffice for a complete bunching the effect will only be partially obtained. But in this case, also the application of the sound wave in the piezoelectric device comprises an essential technical advance with respect to prior art devices.

In the components of the present invention, the new effect of the spatial transport and the timely recombination delay of charge carriers by means of sound waves can be applied in piezoelectric semiconductors and semiconductor layers wherein the piezoelectric field of a sound wave in solid state material (body sound wave) is effective which expands in a piezoelectric body directly adjacent to the semiconductor.

The present invention increases the barrier of breakdown limitations with respect to voltage and power, as previously mentioned, for the bipolar transistor, and the useful frequency range of the power transistor will be broadened by allowing a greater spatial separation of emitter and collector and an acoustically controlled charge transport through the base in the piezoelectric transistor.

In an optoelectronic component element according to this invention, the optical image is raster scanned by means of a succession of body sound impulses and thus converted into an electrical signal. Thus, an electron beam for scanning becomes unnecessary.

A high piezoelectric potential must be achieved in order to obtain the full effect. This can be obtained, on one hand, by means of utilizing a semiconductor material with a large electromechanical coupling constant such as CdS or ZnO. On the other hand, the prior art acousto-electric effect is available for the production and amplification of the sound wave. Advantageously, the operational voltage of the device is thereby also applied for amplification of sound waves in a suitable path within which the sound amplification will be effected.

The sound wave can also be created by piezoelectric transducers or by Gunn diodes which either form an integral part of the piezoelectric component or are attached to the component element without intervening space. All of these devices allow a control of the charge transport by means of changing the propagation direction and intensity of the sound wave.

Turning now to a description of the figures, the arrangement shown in FIG. 1 serves to explain the effect utilized in the invention and consists of a piezoelectric semiconductor member 1 which is connected with a voltage source 4 via ohmic contacts 2 and 3 which will result in a body sound wave due to the acousto-electric effect, with a propagation direction indicated by the arrow 5. Additional charge carriers are injected in an emitter zone 6 by means of light radiation (which is illustrated by an arrow impacting zone 6). The sound wave 5 causes their transport to the part of the body 1 which is positioned between contacts 7 and 8 and whose distance from the zone 6 is denoted by $d$. A current flow via the contacts 7 and 8 and a load resistor 9 is caused by a voltage source 10 and changes as soon as the acoustically transported additional charge carriers arrive between contacts 7 and 8. Thus, a useful voltage fluctuation will result at the load resistor 9 at a time following the injection at zone 6 determined by the distance $d$ divided by the velocity of sound. If one of the contacts 7 and 8 is ohmic and the other arranged as a rectifier contact, a high reverse voltage can be applied which mainly is effective along the space charge region of the rectifier contact. The minority carriers transported acoustically in this area thus result in an amplified useful voltage change at the resistor 9 due to the transistor effect.

Figure 2:
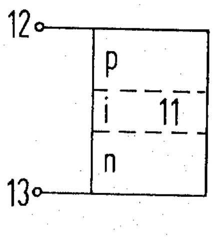
FIG. 2 is a showing of a prior art semiconductor diode.

FIG. 2 shows a schematic cross-section through a prior art semiconductor diode and illustrates a semiconductor member 11 of p-i-n structure with electrical terminals 12 and 13 at the p- and n- areas. After a current flowing through the diode in forward direction has been switched off, numerous injected charge carriers will be in the center i- range of the diode which delay the blocking effect of the diode. The stored charge is removed only by a current flow in the reverse direction or by a relatively slow recombination.

Figure 3:
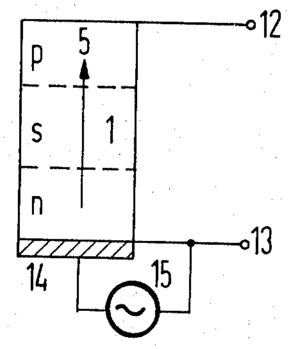
FIG. 3 illustrates a semiconductor diode constructed according to the present invention.

FIG. 3 shows an improved development of the semiconductor diode according to this invention using a common emitter and collector, and comprises a piezoelectric semiconductor member 1, for example, of p-s-n structure with electrical contacts 12 and 13 at the p- and n- regions. An acoustoelectric transducer 14 has been attached at one frontal surface, and it carries out the function of the current circuit 2, 3 and 4 of FIG. 1 in such a way that a body sound wave 5 is produced by means of applying an alternating voltage source 15. The injected charge carriers in the intermediate *s* area can be removed by means of control of a sound source 14. Thus, diodes with great expansion of the intermediate *s* zone can be produced for great reverse voltages, and comprising only a small carrier storage effect.

Figure 4:
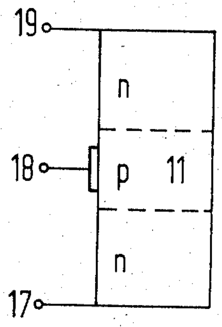
FIG. 4 illustrates a prior art bipolar transistor.

FIG. 4 shows a schematic cross-section through a prior art bipolar transistor. It consists of a semiconductor member 11 of n-p-n structure with an emitter terminal 17, a base terminal 18 and a collector terminal 19. The minority carriers injected by the emitter must diffuse through the base zone in order to become effective in the collector region. The extension of the base plus collector base charge zone must thus be small as compared with the diffusion length, and thus a high collector voltage will cause a breakdown of the transistor.

Figure 5:
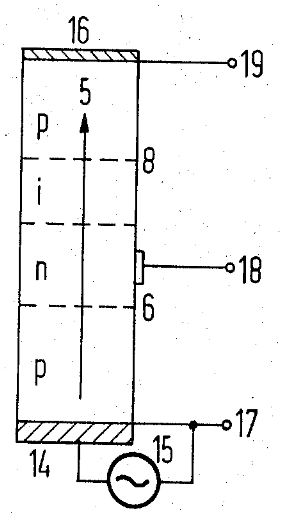
FIG. 5 illustrates an improved bipolar transistor according to the present invention.

FIG. 5 shows an improved bipolar transistor according to this invention. The element consists of a piezoelectric semiconductor member 1, for example, of small p-n-i-p structure. The acoustic charge transport on which this invention is based may also be applied to all other possible transistor structures such as p-n-p, n-p-n, n-p-s-n, etc. The supply of the operational voltage is effected via an emitter terminal 17, a base terminal 18 and a collector terminal 19. The sound wave 5 is produced with the help of the acoustoelectric transducer 14 and an alternating voltage source 15, and it decays in an absorption material 16. Due to the acoustic carrier transport via the path from emitter base p-n junction 6 to base-collector diode 8, this spatial distance can be increased with respect to prior art transistors, and thus the breakdown limits with respect to voltages can be increased. The modulation of the collector current with the sound frequency is either eliminated by means of low pass electrical filtering for low frequency applications or used as a high frequency signal which is coupled out means a parallel resonant circuit replacing resistor 9 and which can be controlled in its amplitude by means of the emitter-base bias.

Figure 6:
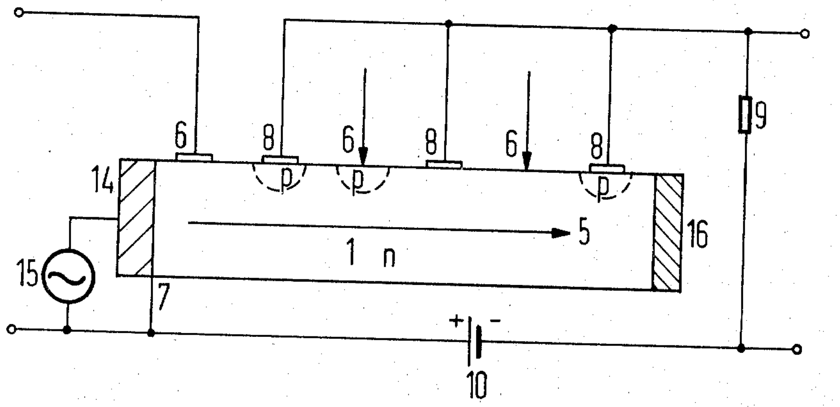
FIG. 6 illustrates an arrangement for distributing electrical charge according to this invention.

A schematic cross-section through a component element with a number of emitters 6 and a number of collectors 8 has been shown in FIG. 6. This element is suited for optoelectronic applications. Light radiation onto the piezoelectric semiconductor body 1 or onto a p-n junction in the body 1 are provided as emitters as well as a diode biased in the forward direction, or the p-n junctions are metal-semiconductor (Schottky) diodes. Diodes biased in the reverse polarity operate as collectors. For instance, the transducer 14 with an alternating current source 15 will serve to produce the sound wave 5 and the terminal 16 for sound absorption. The useful output signal appears at the load resistor 9, and it is produced by the collector bias 10 and current flow in the collector diodes 8. The output signal is only produced when the following conditions obtain:

a. the emitter 6 is injecting carriers, b. the sound wave 5 travels from the emitters 6 to the corresponding collectors 8, and c. a reverse voltage is applied to the collectors.

Certain desired switching functions may be realized by holding one condition, e.g., (*c*) constant in time and giving to the two other conditions a time dependence. Sound pulses resolve the injection state of said emitters in current changes. The time dependent variation of the output signal is given by arrival of the sound pulses at the collector.

Figure 7:
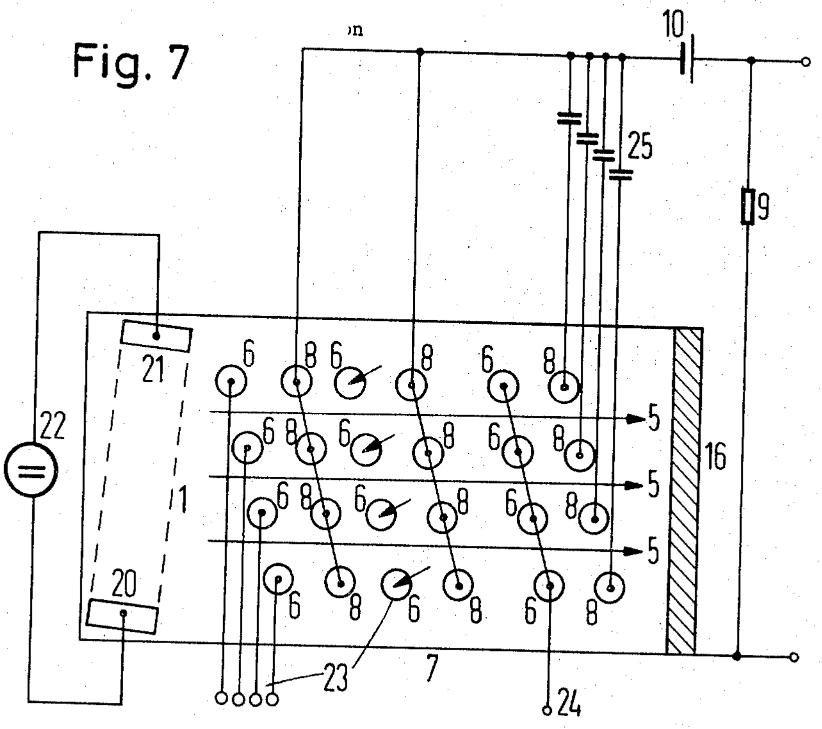
FIG. 7 illustrates a monolithic component element having a number of acoustically-electrically controlled inputs and outputs.

FIG. 7 illustrates a schematic frontal view of a component element illustrated in FIG. 6 in cross-section. The numbering of the parts of this arrangement up to number 16 corresponds to the same elements as in the preceding figure. In order to produce a sound wave 5 in the device of FIG. 7, a Gunn element with ohmic contacts 20 and 21 and a connected direct voltage source 22 may be applied. The sound wave 5 propagates at an acute angle with respect to the traveling direction of the Gunn domain (from 20 towards 21). Two separate possibilities have been illustrated in FIG. 7:

i. with separate emitter connections 6 and joint collectors 8 (arrangement 23)

ii. with joint injecting emitter terminals 24 and separate electric biasing of the collectors which is determined by the respective charge state of the capacitors 25.

If the sound source is pulsed by pulsing the voltage source 22, timed successive voltage impulses will be produced at resistor 9 in the switching possibility (i), corresponding to the injection state of the individual emitters and their spatial position relative to the wave front of the switching impulse. This arrangement can be used as a photoelectric image converter when the image which is transmitted is applied on the surface of the body 1. The radiation can be incident onto the emitter diode or directly upon the semiconductor surface for a photoelectric effect. In switching possibility (ii) a signal will be given at resistor 9 only when the collector 8 which has been hit by the sound impulse is biased by the charge of the respectively connected capacitor 25 in the reverse direction.

The arrangements according to FIGS. 6 and 7 are monolithic devices wherein the injection state of several inputs 6 or 23, respectively, is controlled by the acoustic flux 5 causing voltage changes successively or simultaneously in one or several outputs 9.

What has been said about the modulation of the collector current with the sound frequency in the description of FIG. 5 also applies to FIGS. 1, 3, 6 and 7. The generators of the body sound wave as shown in the individual figures can be interchanged.

The application of the invention for another image converter component is based upon the fact that certain electrically insulating solid state materials such as lithium niobate are known whose piezoelectric properties exceed those of the semiconductors which can presently be produced. Thus, it is an advantage in certain cases to let the stronger spatially periodic electric alternating field of a sound wave propagating in a strongly piezoelectric insulator affect the charge carrier in the semiconductor. The latter is given by a narrow mechanical contact extending over a large surface between insulator and semiconductor as well as the excitation of such acousto-electric surface waves in the insulator which have an electric field component within the semiconductor parallel to the propagation direction. This field component causes the transport and recombination delay of surplus charge carriers in the non-piezoelectric semiconductor adjacent to the boundary layer towards the insulator.

Prior art devices for inducing and amplifying such surface waves are the acousto-electric interdigital transmitters and the acousto-electric amplifier. The surface wave is produced in the interdigital transducer by means of supplying an electric alternating voltage to a conductive interdigital structure upon the surface of the piezoelectric insulator. The acousto-electric surface-wave amplifier is based on an electric current flowing through the semiconductor. Both devices can serve for inducing the surface wave effective in the devices according to this invention. In the case of the amplifier, the acoustic excitation by means of an electric alternating voltage is not required; the thermally caused phonons may also be amplified.

Figure 8:
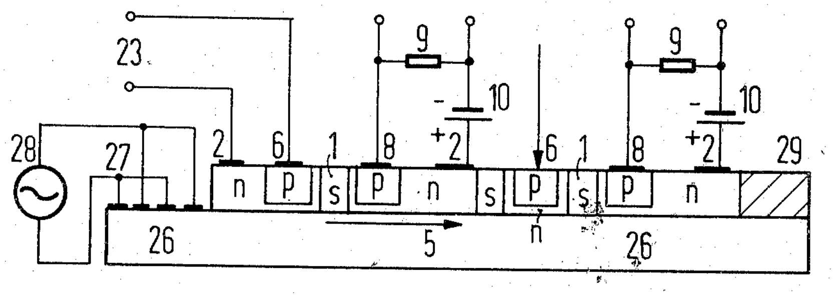
FIG. 8 is another embodiment of the subject matter of the present invention.
Figure 9:
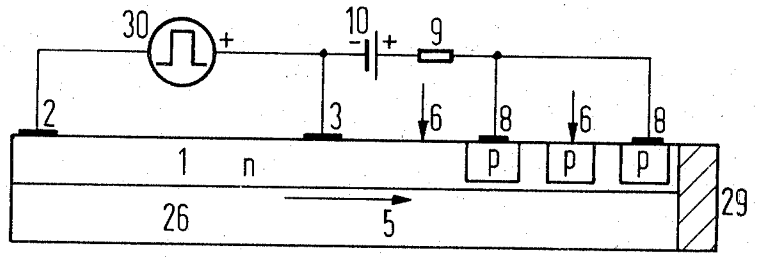
FIG. 9 is a cross-sectional view of a piezoelectric image converter.
Figure 10:
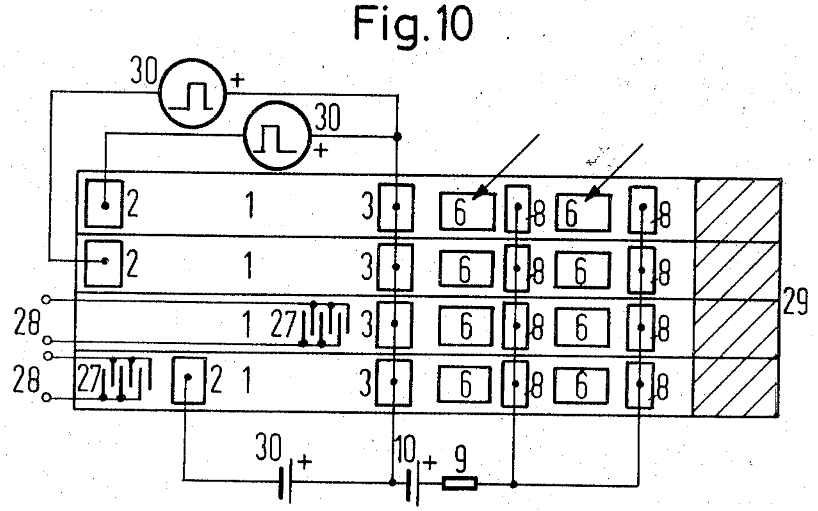
FIG. 10 is a front view of an image converter of the type shown in FIG. 9.

A further modification of the present invention is illustrated in FIGS. 8, 9 and 10. The device shown in FIG. 8 consists of a semiconductor member 1 in the form of a thin strip which rests in face contact with a strongly piezoelectric base member 26, or which has been applied epitaxially onto the latter. An interdigital transducer 27 will produce an acoustic surface wave upon application of an alternating voltage source 28. The surface wave expands in the area of the boundary layer between the semiconductor 1 and the base member 26. Emitter zone 6 and collector zones 8 are embodies in the single crystal semiconductor member 1 and are galvanically insulated by means of electrically insulating semiconductor material (*s*), which will result in freedom from feedback effects between the electrical input and output. The emitter zones may consist of a p-n junction in the *n* material which is supplied with the input signal from the input terminal 23 via the ohmic contact 2 in the forward direction. Thus, charge carriers are produced in addition to the ones present in thermal equilibriums. The injected charge carriers are conveyed from the sound wave 5 into the collector region through the s zone. The collector diode 8 is a p-n junction in the n area which is biased in reverse direction and which is connected to the positive pole of the collector voltage source 10 via the ohmic contact 2. When the charge carriers arrive in the area of the diode 5, they cause a current producing a voltage drop at the load resistors 9. The emitter effect can also occur due to a light incidence (indicated by means of the arrow) upon semiconductor material or diodes. In order to avoid sound reflections, a sound absorption material 29 has been applied.

The sectional showing in FIG. 9 shows a component element whereby the sound wave is produced by means of applying a preferably pulsating direct voltage 30 to the semiconductor member 1 via the ohmic contacts 2,3 due to the acousto-electric amplification process. The drift movement of the charge carriers thereby determines the propagation direction 5 of the sound. As in FIG. 8, emitters 6 and collector circuit elements 8, 9, 10 and 3 are also provided but here they are not galvanically insulated.

The image converter which has been schematically illustrated in FIG. 10 consists of individual elements according to FIG. 9. Corresponding to the intensity distribution of the image focused upon the surface, different injection intensities will be produced in the individual emitters 6. The line-by-line scanning is caused by means of successive electric pulses 30 at the excitation contacts 2 and 3 of the individual line strips. The excitation contacts 2 and 3 can be replaced by interdigital transducers 27 or combined with them. The collectors 8 are all electrically connected with each other or they may be partly connected for separate adjustability, and are biased in the reverse direction while associated with one or several load resistors 9.

Various modifications for the previously described circuits are possible. By replacing resistor 9 by a filter circuit, preferably a parallel resonant circuit, the sound frequency in the output voltage is utilized. Replacing resistor 9 by a low pass filter circuit can be used to suppress the sound frequency component of the output.

I claim as my invention:

1. An electrical component device comprising a semiconductor member, first charge injector means for injecting majority charge carriers into said semiconductor member at a first location, second charge injector means for injecting minority charge carriers into said semiconductor member at a second location, piezoelectric means associated with said semiconductor member at a position for generating sound waves from said piezoelectric means which move generally from said second location toward said first location to cause a spatial transport of the injected minority charge carriers in the direction of sound wave propagation and thereby greatly increasing the breakdown voltage and power capability of the device.

2. The device of claim 1 which includes electrode means connected to said piezoelectric body to supply energy thereto, and light means arranged to irradiate portions of said semiconductor body and comprising said first charge injector means.

3. The device of claim 1 wherein said first charge injector means comprises an emitter zone and said second charge injector means comprises a collector zone on said semiconductor member which are separated by a region of very weakly doped semiconductor material.

4. The device of claim 1 which includes a plurality of charge injector means and collector means in said semiconductor member, and a plurality of electrical contacts respectively connected to said plurality of charge injector means and said collector means.

5. The device of claim 4 in which the electrical contacts of said collector means and said plurality of charge injector means are at least partly interconnected.

6. The device of claim 5 which includes means for pulsing said piezoelectric means to produce sound waves of short duration.

7. The device of claim 1 which includes an electrical filter for the sound frequency to absorb sound energy coupled to the output of said semiconductor member, the voltage across said filter being dependent on the injected charge carriers and the intensity of the sound waves.

8. The device of claim 1 which includes a collector means, a load coupled to said collector means, and an electrical filter interposed between said collector means and said load to filter out frequency components arising from the piezoelectric means.

9. A semiconductor device comprising a body of semiconductor material having *s* region and p- and n-type regions on opposite sides thereof, a piezoelectric sound wave generator attached to said n type region of said body of semiconductor material to propogate sound waves through said body from said n- to p-type regions, and an alternating voltage source connected to said piezoelectric sound wave generator to drive it.

10. A transistor comprising a body of semiconductor material formed with a first region of a first conductivity type at one end thereof, a second region of opposite conductivity type joining said first region, a third region of intrinsic semiconductor material joining said second region, a fourth region of a first conductivity type joining said third region, a piezoelectric sound wave generator attached to said first region of said body of semiconductor body to propogate sound waves through said body from said first region through said second, third, and fourth regions, an alternating voltage source connected to said piezoelectric sound wave to drive it, a first electrical contact connected to said first region to form an emitter contact, a second electrical contact connected to said second region to form a base contact, and a third electrical contact connected to said fourth region to form a collector contact.

11. A transistor according to claim 2 including a sound absorber connected to the fourth region of said semiconductor body to absorb sound energy which has traversed said body.

12. A transistor comprising a body of semiconductor material formed with a first region of a first conductivity type at one end thereof, a second region of opposite conductivity type joining said first region, a third region of mildly doped semiconductor material joining said second region, a fourth region of a first conductivity type joining said third region, a piezoelectric sound wave generator attached to said first region of said body of semiconductor body to propogate sound waves through said body from said first region through said second, third, and fourth regions, an alternating voltage source connected to said piezoelectric sound wave to drive it, a first electrical contact connected to said second region to form a base contact, and a third electrical contact connected to said fourth region to form a collector contact.

13. A transistor according to claim 12 including a sound absorber connected to the fourth region of said semiconductor body to absorb sound energy which has traversed said body.

14. An electrical device comprising a planar piezoelectric body, a planar semiconductor body attached to said planar piezoelectric body, an alternating generator connected to one end of said piezoelectric body to excite it, a plurality of regions of different conductivity types formed in said semiconductor body and sound energy from said piezoelectric body coupled into said semiconductor body to increase the life of carriers therein thus increasing the breakdown voltage and the power capabilities.

15. An electrical device according to claim 14 including an absorber connected to said piezoelectric and semiconductor bodies at second ends remote from said alternating generator.

* * * * *

UNITED STATES PATENT OFFICE
CERTIFICATE OF CORRECTION

Patent No. 3,792,321 Dated February 12, 1974

Inventor(s) Franz Seifert

It is certified that error appears in the above-identified patent and that said Letters Patent are hereby corrected as shown below:

In Claim 3, at column 8, Line 38, delete "first" and insert therefore --second--, and at Lines 39-40, delete "second" and insert therefore--first--.

Signed and sealed this 10th day of December 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
☆ U.S. GOVERNMENT PRINTING OFFICE : 1969 O—366-334